United States Patent
Surthi (10) Patent No.: US 8,119,543 B2
(45) Date of Patent: Feb. 21, 2012

(54) METHODS OF REDUCING DEFECT FORMATION ON SILICON DIOXIDE FORMED BY ATOMIC LAYER DEPOSITION (ALD) PROCESSES

(75) Inventor: Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/965,225

(22) Filed: Dec. 10, 2010

(65) Prior Publication Data

US 2011/0081786 A1 Apr. 7, 2011

Related U.S. Application Data

(62) Division of application No. 12/114,306, filed on May 2, 2008, now Pat. No. 7,858,535.

(51) Int. Cl.
*H01L 21/316* (2006.01)

(52) U.S. Cl. ................. 438/787; 257/E21.278

(58) Field of Classification Search .......... 438/787; 427/255.15, 255.18, 255.37, 255.393; 257/E21.241, 257/E21.271, E21.278
See application file for complete search history.

(56) References Cited

U.S. PATENT DOCUMENTS

| | | | |
|---|---|---|---|
| 6,090,442 A | 7/2000 | Klaus et al. | |
| 6,992,019 B2 | 1/2006 | Lee et al. | |
| 7,018,469 B2 | 3/2006 | Li et al. | |
| 7,022,184 B2 | 4/2006 | Van Wijck | |
| 7,077,904 B2 | 7/2006 | Cho et al. | |
| 7,101,753 B2 | 9/2006 | Kamiyama et al. | |
| 7,115,528 B2 | 10/2006 | Vaartstra et al. | |
| 2004/0018694 A1 | 1/2004 | Lee et al. | |
| 2004/0219746 A1 | 11/2004 | Vaartstra et al. | |
| 2005/0061234 A1 | 3/2005 | Li et al. | |
| 2006/0040510 A1 | 2/2006 | Lee et al. | |
| 2006/0090694 A1 | 5/2006 | Cho et al. | |
| 2007/0111545 A1 | 5/2007 | Lee et al. | |
| 2008/0113097 A1 | 5/2008 | Mahajani et al. | |
| 2008/0296650 A1 | 12/2008 | Ahn et al. | |
| 2009/0042404 A1 | 2/2009 | Surthi | |
| 2009/0176379 A1 | 7/2009 | Surthi | |
| 2009/0209081 A1 | 8/2009 | Matero et al. | |

FOREIGN PATENT DOCUMENTS

EP 1383163 A2 1/2004
JP 200440110 A 1/2004

*Primary Examiner* — Mary Wilczewski
*(74) Attorney, Agent, or Firm* — Traskbritt (57) ABSTRACT

Methods for reducing and inhibiting defect formation on silicon dioxide formed by atomic layer deposition (ALD) are disclosed. Defect reduction is accomplished by performing processing on the silicon dioxide subsequent to deposition by ALD. The post-deposition processing may include at least one of a pump/purge cycle and a water exposure cycle performed after formation of the silicon dioxide on a substrate.

16 Claims, 7 Drawing Sheets

METHODS OF REDUCING DEFECT FORMATION ON SILICON DIOXIDE FORMED BY ATOMIC LAYER DEPOSITION (ALD) PROCESSES

CROSS-REFERENCE TO RELATED APPLICATION

This application is a divisional of U.S. patent application Ser. No. 12/114,306, filed May 2, 2008, now U.S. Pat. No. 7,858,535, issued Dec. 28, 2010, the disclosure of which is hereby incorporated herein by this reference in its entirety.

TECHNICAL FIELD

Embodiments of the invention relate to methods of reducing and inhibiting defect formation on silicon dioxide during and after formation by atomic layer deposition (ALD). More particularly, embodiments relate to post-deposition processing of the silicon dioxide formed by ALD processes.

BACKGROUND

Atomic layer deposition (ALD) processes are used to produce thin, conformal films having high thickness accuracy and step coverage. ALD utilizes a series of sequential, self-limiting surface reactions, each forming a monolayer (e.g., a layer one atom thick) of material, to form the film. ALD provides atomic layer control and enables the films to be successfully deposited on structures having high aspect ratios. ALD conventionally uses two or more gaseous precursors, each being sequentially introduced into a reaction chamber. A wide variety of materials may be deposited by ALD, many of which are used in the fabrication of semiconductor devices. Silicon dioxide ($SiO_2$), a commonly used electrically insulative material in semiconductor device fabrication, may be readily deposited by ALD. As used herein, the term "ALD $SiO_2$" means and includes silicon dioxide formed by an ALD process.

Silicon dioxide formation by ALD is conducted at temperatures from about 320° C. to about 530° C. by sequentially exposing a substrate to a gaseous, silicon-containing precursor, such as tetrachlorsilane ($SiCl_4$), and an oxygen-containing precursor, such as water. One possible mechanism for the surface reactions of the tetrachlorsilane ($SiCl_4$) and water is as follows:

$SiOH^* + SiO_x \rightarrow SiOSiCl_3^* + HCl$     (Reaction 1)

$SiCl^* + H_2O \rightarrow SiOH^* + HCl$     (Reaction 2)

where * indicates a surface species.

Forming silicon dioxide by ALD includes exposing the substrate, which is located in a reaction chamber, to the silicon-containing precursor to accomplish chemisorption of silicon species onto the substrate. Theoretically, the chemisorption forms a silicon-containing monolayer that is uniformly one atom or molecule thick on the entire, exposed substrate. Excess silicon-containing precursor is purged from the reaction chamber and the substrate is exposed to the oxygen-containing precursor. The oxygen-containing precursor chemisorbs onto the silicon-containing monolayer, forming an oxygen-containing monolayer. Excess oxygen-containing precursor is then purged from the reaction chamber. These acts are repeated to form silicon dioxide having a desired thickness of the substrate. The silicon- and oxygen-containing precursors may be mixed with a catalyst, such as pyridine, to speed up deposition while decreasing the reaction temperature in a range of from about 50° C. to about 100° C. Depositing silicon dioxide films at low temperatures is advantageous in several circumstances due to the thermally sensitive nature of substrates or materials deposited thereon.

Purging of the reaction chamber may involve a variety of techniques including, but not limited to, contacting the substrate, monolayer, or silicon dioxide with an inert gas and reducing the pressure within the reaction chamber such that the concentration of reactants (silicon-containing precursor, oxygen-containing precursor, catalyst) in the reaction chamber is reduced. Examples of inert gases include, for example, nitrogen ($N_2$), argon (Ar), helium (He), neon (Ne), krypton (Kr), and xenon (Xe). In conventional ALD processes, over half of the processing time needed to deposit silicon dioxide by ALD may be spent in pump/purge cycles between reactions to minimize parasitic chemical vapor deposition (CVD) reactions. Thus, the processing time may be reduced by decreasing the pump/purge time. However, decreasing the pump/purge time is problematic due to the incomplete removal of reactants and reaction by-products which may lead to: i) a non-uniform thickness of the film across the substrate; and ii) the formation of defects on the surface of the silicon dioxide formed by ALD. The defect formation is especially enhanced when silicon dioxide is deposited on structures including narrow features or openings, such as during silicon dioxide spacer formation.

As an example, a cycle of an ALD process for forming silicon dioxide may include pulsing the silicon-containing precursor material, such as hexachlorodisilane (HCD), or other suitable silicon-containing precursor, into the reaction chamber for about 10 seconds, pumping the reaction chamber for about 10 seconds, purging the reaction chamber by pumping an inert gas into the reaction chamber for about 10 seconds, repeating the pump/purge sequence, pulsing an oxygen-containing precursor, such as water, into the reaction chamber for about 20 seconds, pumping the reaction chamber for about 10 seconds, pulsing the inert gas into the reaction chamber for about 10 seconds, and again repeating the pump/purge sequence. The pyridine catalyst may be flowing during either half reaction or both. This cycle may be repeated until the desired thickness of the $SiO_2$ is achieved in a single layer or other configuration. The total cycle time is about 118 seconds, about 80 seconds of which is pump/purge time.

To reduce fabrication time and cost, it may be desirable to reduce the pump and purge times during the ALD $SiO_2$ process. As an example, the modified sequence may include introducing a pulse of the silicon-containing precursor material, such as HCD or other suitable silicon-containing precursor, into the reaction chamber for about 10 seconds, pumping the reaction chamber for about 3 seconds, pulsing an inert gas into the reaction chamber for about 3 seconds, pulsing the oxygen-containing precursor, such as water, into the reaction chamber for about 20 seconds, pumping the reaction chamber for about 3 seconds and pulsing nitrogen gas into the reaction chamber for about 9 seconds. Thus, the total time for conducting a single ALD cycle is about 56 seconds, about 18 seconds of which is pump/purge time. Therefore, reducing pump/purge time may substantially reduce processing times associated with ALD $SiO_2$ processes.

However, reducing pump/purge times during ALD $SiO_2$ processes causes an undesirable increase in defect formation on the surface of silicon dioxide, especially in narrow regions between the silicon dioxide film. Increased defect density and probability has been observed in devices with a 35 nm feature size as compared to devices with a 50 nm feature size. While not wishing to be bound by any particular theory, it is believed that the defects may be formed as a result of chloride- (Cl), fluoride- (Fl), or ammonium- ($NH_4^+$) containing by-products trapped in the narrow regions.

Figure 1:
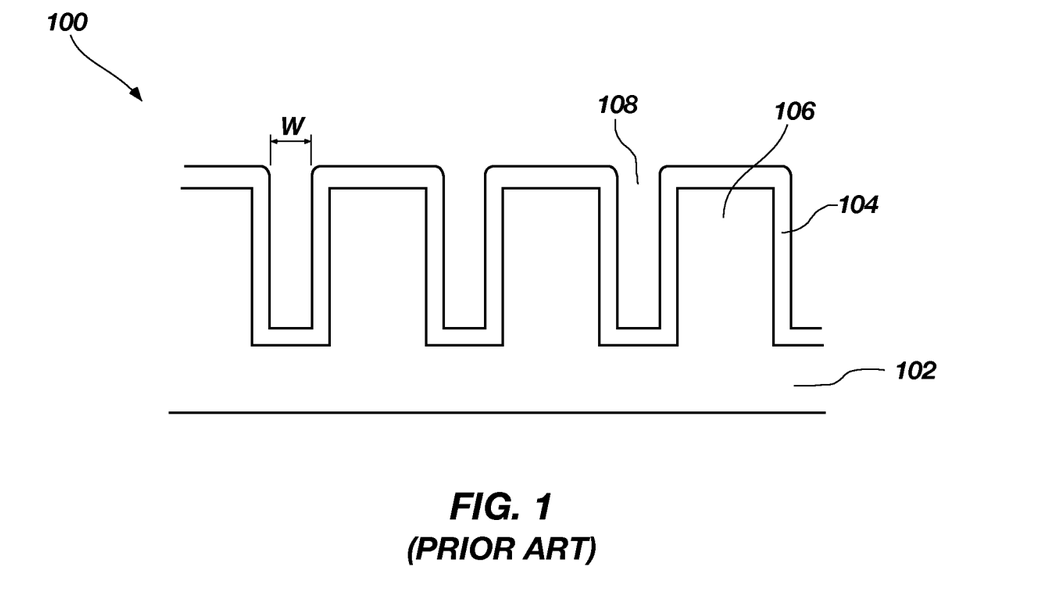
FIG. 1 is a cross-sectional view of a semiconductor structure including narrow features formed by a conventional ALD process.

ALD processes may be used to form silicon dioxide on a substrate with precise thickness control and uniformity. FIG. 1 shows a semiconductor structure 100 including a substrate 102 having a plurality of discrete structures 106 with narrow regions 108 therebetween. ALD $SiO_2$ 104 is formed over and in contact with the substrate 102. After formation of ALD $SiO_2$ 104, the narrow regions 108 may have a width "W" in a range of from about 10 nm to about 100 nm. As ALD cycle times continue to decrease, the narrow regions 108 between the plurality of discrete structures 106 become ever more significant as potential nucleation sites for the formation of defects. In other words, as the width W of the narrow regions 108 decreases, the defect density and probability increase. An increased defect density has been observed for narrow regions 108 having a width W of 35 nm compared to narrow regions 108 having a width W of 50 nm. Such defects may adversely affect semiconductor fabrication processes, for example, by interfering with subsequent etching or patterning processes.

Accordingly, there is a need in the art for improved methods of forming silicon dioxide by ALD so that silicon dioxide structures can be scaled to smaller feature sizes without leading to higher defectivity.

DETAILED DESCRIPTION

Methods for reducing defect formation on silicon dioxide using ALD processes are disclosed. For convenience, the term "ALD $SiO_2$ process," as used herein, means and includes a process of forming $SiO_2$ using ALD and the term "ALD $SiO_2$" means and includes $SiO_2$ formed by ALD. The ALD $SiO_2$ process includes the period of time during which reactants and/or gaseous precursors react with one another or are removed from a reaction chamber to form the ALD $SiO_2$. At the end of the ALD $SiO_2$ process, the formation of the ALD $SiO_2$ is substantially complete. The ALD $SiO_2$ is formed on a substrate, for example, in a memory device or other semiconductor device fabrication. After conducting the ALD $SiO_2$ process to form the ALD $SiO_2$ but before removing the substrate from the chamber, the ALD $SiO_2$ is subjected to post-deposition processing, which produces an ALD $SiO_2$ surface that is substantially free of defects. Therefore, as used herein, the term "post-deposition processing" or grammatical equivalents thereof, means and includes processes conducted after the ALD $SiO_2$ process, such as after the formation of the ALD $SiO_2$ is substantially complete.

As used herein, the term "substrate" means and includes a base material or construction upon which materials, such as the ALD $SiO_2$, are formed. The substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, or indium phosphide. The substrate may be doped or undoped.

In a first reaction of the ALD $SiO_2$ process, a silicon-containing precursor may be introduced to a reaction chamber with pyridine and may chemisorb to the substrate surface. The silicon-containing precursor may include a silicon hydride or silane, such as hexachlorodisilane (HCD, $Si_2Cl_6$), dichlorosilane (DCS, $SiH_2Cl_2$), silane ($SiH_4$), disilane ($H_3SiSiH_3$), trichlorosilane (TCS, $SiHCl_3$), or any other silicon-containing compound suitable for use as a precursor. The silicon-containing precursor supplied in this phase may be selected such that the amount of silicon-containing precursor that can be bound to the substrate surface is determined by the number of available binding sites and by the physical size of the chemisorbed species (including ligands). The chemisorbed silicon-containing monolayer formed by the silicon-containing precursor is self-terminated with a surface that is non-reactive with the remaining chemistry used to form the silicon-containing monolayer.

Subsequent pulsing with an inert gas removes excess silicon-containing precursor from the reaction chamber, specifically the silicon-containing precursor that has not chemisorbed to the substrate surface. The inert gas may be nitrogen ($N_2$), argon (Ar), helium (He), neon (Ne), krypton (Kr), or xenon (Xe). Purging the reaction chamber also removes volatile by-products produced during the ALD $SiO_2$ process. In one embodiment, the inert gas may be nitrogen ($N_2$). The inert gas may be introduced into the reaction chamber, for example, for about 10 seconds. After purging, the reaction chamber may be evacuated or "pumped" to remove gases, such as excess silicon-containing precursor or volatile by-products. For example, the silicon-containing precursor may be purged from the reaction chamber by techniques including, but not limited to, contacting the substrate and/or silicon-containing monolayer with the inert gas and/or lowering the pressure in the reaction chamber to below the deposition pressure of the silicon-containing precursor to reduce the concentration of the silicon-containing precursor contacting the substrate and/or chemisorbed species. Additionally, purging may include contacting the silicon-containing monolayer with any substance that allows chemisorption by-products to desorb and reduces the concentration of the silicon-containing precursor before introducing the oxygen-containing precursor. A suitable amount of purging to remove the silicon-containing precursor and the volatile by-products can be determined experimentally, as known to those of ordinary skill in the art. The pump and purge sequences may be repeated multiple times. The pump and purge sequences may start or end with either the pump or purge act. The time and parameters, such as gas flow, pressure and temperature, during the pump and purge acts may be altered during the pump and purge sequence. The reduction of purging and/or pumping time increases the amount of ALD $SiO_2$ that is deposited per minute (Å/minute) and may lead to an increase in the growth rate of silicon dioxide.

The second reaction of the ALD $SiO_2$ process introduces an oxygen-containing precursor and pyridine into the reaction chamber to form an oxygen-containing monolayer over the silicon-containing monolayer. The oxygen-containing monolayer and the silicon-containing monolayer react to form the ALD $SiO_2$. Reaction by-products and excess oxygen-containing precursor are removed from the reaction chamber by using the pump and purge sequence as described above. For example, a purge may be performed by introducing the inert gas into the reaction chamber. Conventionally, precursor pulse times range from about 0.5 second to about 30 seconds. The ALD $SiO_2$ may be deposited on the substrate through successive or repetitive ALD cycles, where each cycle deposits a monolayer of silicon dioxide. The thickness of silicon dioxide is achieved by exposing the substrate to multiple, repetitious ALD cycles.

Figure 2:
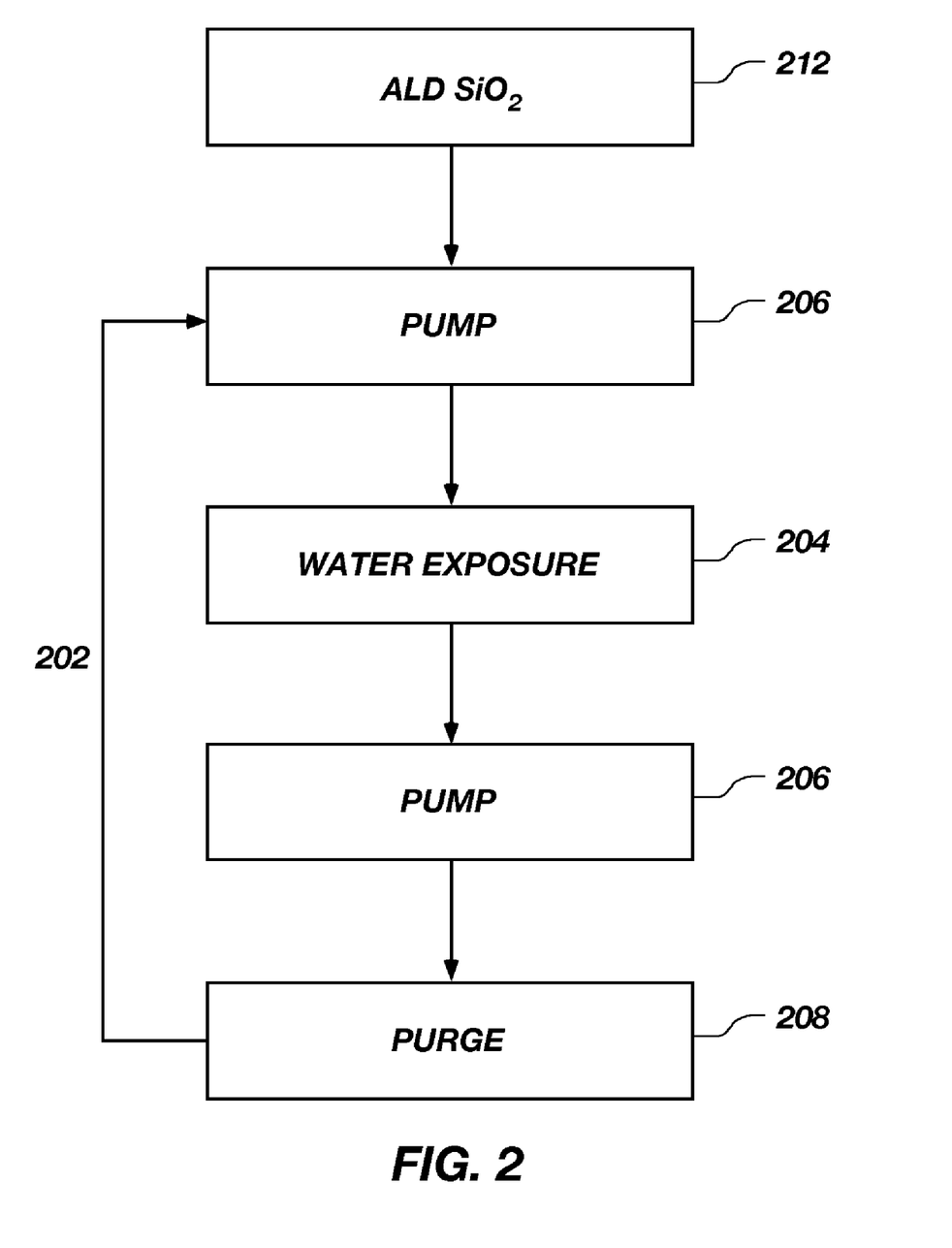
FIGS. 2-4 are flow charts illustrating methods of reducing defect formation on silicon dioxide formed by ALD in accordance with embodiments of the invention.

After forming the ALD $SiO_2$, the ALD $SiO_2$ may be subjected to post-deposition processing such that the ALD $SiO_2$ is substantially free of defects. The post-deposition processing may include, for example, at least one of a pump/purge cycle and water exposure and may be performed after completion of the ALD $SiO_2$ process. As used herein, the term "water exposure" means and includes subjecting the ALD $SiO_2$ to water. By way of non-limiting example, the water may be deionized water or reagent grade water. The water may come into contact with, or may react with, the ALD $SiO_2$ or, alternatively, with gaseous by-products formed during the ALD $SiO_2$ process. In one embodiment, the post-deposition processing may include a pump/purge cycle and water exposure. For example, the water exposure may be incorporated into a pump/purge cycle, as illustrated in FIG. 2, which is a flow chart that illustrates an embodiment of the post-deposition processing including a water exposure cycle 202. The water exposure cycle 202 may include at least one pump act 206, at least one water exposure act 204, and at least one purge act 208 that may be performed in the reaction chamber after formation and completion of the ALD $SiO_2$ 212 deposition cycles. One cycle of the water exposure cycle 202 may include a series of pump acts 206, water exposure acts 204 and purge acts 208. The pump act 206 may include at least partially removing surplus precursor gases and reaction by-products from the reaction chamber and may be an evacuation performed using a vacuum pump to remove gases from the reaction chamber. As a non-limiting example, the pump act 206 may be performed for a time in a range of from about 5 seconds to about 60 seconds. During the water exposure act 204, the water may be introduced into the reaction chamber, for example, by being pulsed for from about 10 seconds to about 120 seconds, such as from about 30 seconds to about 60 seconds. The water may be heated prior to, or upon entry into, the reaction chamber. As a non-limiting example, the water may be stored in a container, more particularly an ampoule, maintained at a temperature in the range of from about 20° C. to about 50° C., such as from about 30° C. to about 50° C. and, more particularly about 40° C. As a non-limiting example, the temperature of the water may be maintained in a delivery line from the ampoule to the reaction chamber or within the chamber.

The purge act 208 may include the introduction of an inert gas into the reaction chamber. For example, nitrogen may be pulsed into the reaction chamber for from about 5 seconds to about 60 seconds. However, other inert gases may be used, such as Ar, He, Ne, Kr, and Xe, and combinations thereof. The temperature and flow rate of the inert gas may be adjusted during the purge act 208 of the water exposure cycle 202 to control the formation of defects on the surface of deposited ALD $SiO_2$. The temperature of the inert gas introduced into the reaction chamber may be in a range of from about 50° C. to about 200° C. and, more particularly, in a range of from about 75° C. to about 150° C. As a non-limiting example, the temperature of the inert gas may be maintained at greater than about 75° C. using a container, such as an ampoule, or a heated delivery line or in-line heater used to feed the inert gas into the reaction chamber. The increased temperature of the inert gas during the post-deposition processing may substantially reduce defect formation, possibly due to better removal of by-products from the reaction chamber. To further decrease defect growth on the surface of ALD $SiO_2$, the inert gas may be introduced into the reaction chamber at a flow rate of greater than about 0.5 slm. The flow rate may be dependent on the type of reaction chamber used, as well as the size and number of holes in the reaction chamber through which the inert gas may pass. By way of non-limiting example, the inert gas may be introduced into the reaction chamber at a flow rate in a range of from about 0.5 slm to about 100 slm.

As a non-limiting example, the water exposure cycle 202 may include a pump act 206, a water exposure act 204, a pump act 206 and a purge act 208 performed sequentially, as depicted in FIG. 2. However, the acts 204, 206, and 208 may be performed any number of times and in any order, as would be recognized by one of ordinary skill in the art. The water introduced into the reaction chamber during the water exposure cycle 202 may contact or react with the ALD $SiO_2$ 212. Additionally, water exposure cycle 202 may remove unreacted gases and by-products from the reaction chamber.

The water exposure cycle 202 may be repeated as shown in FIG. 2 to achieve the ALD $SiO_2$ surface substantially free of defects. As a non-limiting example, the water exposure cycle 202 may be repeated from one time to ten times. The total time for one water exposure cycle 202 may be in a range of from about 0.5 minute to about 6 minutes.

The conditions in the reaction chamber during the post-deposition processing may be controlled during the water exposure cycle 202 to further reduce the formation of defects on the ALD $SiO_2$. For example, the temperature of the reaction chamber may be controlled to reduce the formation of defects on the ALD $SiO_2$. By way of non-limiting example, during the water exposure cycle 202, the temperature within the reaction chamber may be increased by from about 10° C. to about 50° C. relative to the temperature of the reaction chamber during the deposition of the ALD $SiO_2$. During the post-deposition processing, the temperature within the reaction chamber may be at a non-steady state but above the temperature of the reaction chamber during the deposition of the ALD $SiO_2$.

Figure 3:
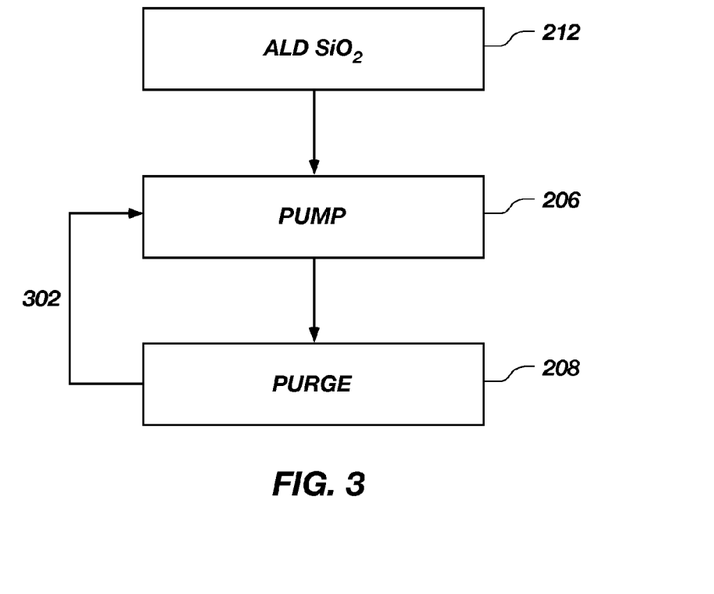

In another embodiment, the post-deposition processing may include a pump/purge cycle following formation of the ALD $SiO_2$ 212 to reduce the formation of defects. FIG. 3 is a flow chart illustrating an embodiment of such a pump/purge cycle 302. The pump/purge cycle 302 may include pump act 206 and purge act 208. As a non-limiting example, the pump/purge cycle 302 may employ the inert gas to remove volatile materials from the reaction chamber in purge act 208.

As shown in FIG. 3, the pump/purge cycle 302 may include pump act 206 to at least partially remove gases contained in the reaction chamber, followed by purge act 208 to introduce the inert gas into the reaction chamber. The pump act 206 may include at least partially removing surplus precursor gases, catalyst, inert gas and by-products from the reaction chamber. The reaction chamber may be evacuated for an amount of time in a range of from about 5 seconds to about 60 seconds. The purge act 208 may include introducing an inert gas into the reaction chamber for a time in a range of from about 5 seconds to about 60 seconds. During the purge act 208, the inert gas may be introduced into the reaction chamber at a temperature of greater than about 50° C., and more particularly, at a temperature in the range extending from about 75° C. to about 150° C. By way of non-limiting example, the inert gas may be nitrogen and may be stored in an ampoule or passed through a delivery line maintained at a temperature of about 150° C. The inert gas may be introduced into the reaction chamber at a flow rate of greater than about 0.5 slm, more particularly about 30 slm. The pump/purge cycle 302 may include more than one pump act 206 and purge act 208. If multiple pump acts 206 and purge acts 208 are used, each of the pump acts 206 and purge acts 208 may be different from one another. Additionally, the conditions during each of the pump acts 206 and purge acts 208, such as time, temperature and flow rate, may be varied during the pump/purge cycle 302. The pump/purge cycle 302 may be repeated in succession (as shown by arrow labeled 302) to substantially remove by-products from the reaction chamber. Generally, increasing pump/purge cycle times during post-deposition processing may further reduce the formation of crystal growth following deposition of ALD $SiO_2$.

By way of non-limiting example, pump/purge cycle 302 may include a pump act 206 of 60 seconds to remove volatile gases and a purge act 208 of 60 seconds by introducing the inert gas for 60 seconds. As another example, the pump/purge cycle 302 may include a pump act 206 of 30 seconds and a purge act 208 of 30 seconds. The purge act 208 may include pulsing the inert gas into the reaction chamber at a flow rate of greater than about 0.5 slm. Thus, if the post-deposition pump/purge cycle 302 is repeated twice in succession, the total time for the pump/purge cycle 302 may be in a range of from about 2 to 4 minutes. As a non-limiting example, the post-deposition pump/purge cycle 302 may be repeated in succession from one to eight times. Additionally, other post-deposition acts, such as a water exposure cycle, may be performed between cycles of the pump/purge cycle 302.

During the pump/purge cycle 302, the temperature of the reaction chamber may be controlled or maintained at a temperature in a range extending from about 5° C. to about 50° C. above the deposition temperature, as previously described. By way of non-limiting example, if the ALD $SiO_2$ process is performed at a temperature of about 75° C., the reaction chamber may be heated to a temperature in a range of from about 85° C. to about 125° C., and more particularly, in a range of from about 90° C. to about 100° C., to reduce the formation of defects on the ALD $SiO_2$ during the post-deposition processing. During some part of the pump/purge cycle 302, the temperature of the reaction chamber may also be in a non-steady state, however, at a temperature above the deposition temperature. For example, the temperature within the reaction chamber may be increased to a desired temperature for post-deposition processing during the pump/purge cycle 302. However, the temperature within the reaction chamber may not reach the desired temperature for a time of from about 5 minutes to about 10 minutes after post-deposition processing begins. Thus, the reaction chamber temperature is in a non-steady state as the temperature change occurs.

Figure 4:
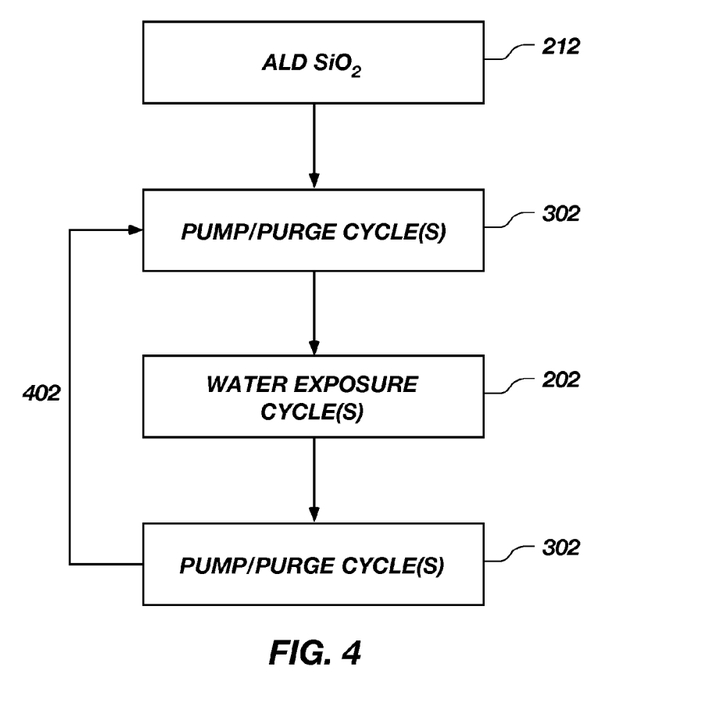

It will be recognized by those of ordinary skill in the art that other combinations of water exposure acts 202, pump acts 206, and purge acts 208 may be used to control the formation of defects on silicon dioxide formed by processing of the ALD $SiO_2$ 212. For example, FIG. 4 shows a flow chart that illustrates another embodiment of post-deposition processing of the ALD $SiO_2$ 212. The post-deposition processing cycle 402 may include a sequence of at least one pump/purge cycle 302, as described with respect to FIG. 3, and at least one water exposure cycle 202, as described with respect to FIG. 2. For example, the pump/purge cycle 302 may include pumping the reaction chamber for about 60 seconds to remove gases and by-products, purging the reaction chamber with nitrogen at a temperature of about 150° C. and at a flow rate of about 30 slm for about 60 seconds, pumping the reaction chamber to remove gases and by-products for about 60 seconds and purging the reaction chamber with nitrogen at a temperature of about 150° C. at a flow rate of about 30 slm for about 60 seconds. After the deposition of the ALD $SiO_2$ 212, the pump/purge cycle 302 may be performed as explained above. As a non-limiting example, the pump/purge cycle 302 may be repeated up to eight times. During the pump/purge cycle 302, the reaction chamber may be maintained, for example, at a temperature of from about 5° C. to about 50° C. above the deposition temperature. By way of non-limiting example, if the ALD $SiO_2$ is deposited at 75° C., the pump/purge cycle 302 may be performed at a temperature in a range of from about 80° C. to about 125° C.

Following the pump/purge cycle 302, the ALD $SiO_2$ 212 may be treated in the reaction chamber using the water exposure cycle 202. The water exposure cycle 202 may be performed as described above. By way of non-limiting example, the water exposure cycle 202 may include pumping the reaction chamber for about 30 seconds, pulsing water at a temperature of greater than 50° C. into the reaction chamber for about 30 seconds, pumping the reaction chamber at a flow rate of about 30 slm for about 30 seconds and introducing nitrogen at a temperature of about 150° C. into the reaction chamber at a flow rate of about 30 slm for about 30 seconds. The water exposure cycle 202 may be repeated up to four times and during the water exposure cycle 202, the reaction chamber may be maintained, for example, at a temperature of about 5° C. to about 50° C. above the deposition temperature.

Subsequent to the water exposure cycle 202, another pump/purge cycle 302 may be performed by using the technique described in previous paragraphs. By way of non-limiting example, another pump/purge cycle 302 may be performed by pumping the reaction chamber for about 60 seconds to remove gases, pulsing nitrogen at a temperature of about 150° C. into the reaction chamber for 60 seconds, pumping the reaction chamber to remove gases for about 60 seconds and pulsing nitrogen at a temperature of about 150° C. into the reaction chamber for 60 seconds. The pump/purge cycle 302 may be repeated up to four times. During the pump/purge cycle 302, the reaction chamber may be maintained, for example, at a temperature of from about 10° C. to about 50° C. above the deposition temperature. The post-deposition processing may be used to prevent or reduce defect formation on ALD $SiO_2$ during the fabrication of a semiconductor structure. For example, the completed ALD $SiO_2$ may be treated, post-deposition, using at least one of a pump/purge cycle and a water exposure cycle to form the semiconductor structure including silicon dioxide features that are substantially free of surface defects.

The ALD $SiO_2$ process and the post-deposition processing may be used, for example, in the fabrication of semiconductor structures. By way of non-limiting example, the post-deposition processing of the ALD $SiO_2$ may be used to reduce or remove defects when ALD $SiO_2$ is deposited in narrow regions between features formed in or on the semiconductor structures. In one embodiment, the ALD $SiO_2$ may be formed on a surface of a substrate 102 including a plurality of discrete structures 106 therein, as illustrated in FIG. 1, where width W is below about 100 nm. The ALD $SiO_2$ may be formed on the substrate 102 over a plurality of discrete structures 106 and within the narrow regions 108 in a reaction chamber by an ALD SiO$_2$ process. After formation of the ALD SiO$_2$ over the plurality of discrete structures 106, the post-deposition processing cycle may be performed in the same reaction chamber before the substrate 102 is removed. During the post-deposition processing cycle, the reaction chamber may be maintained at a temperature of at least about 10° C. above the deposition temperature or may be in a non-steady state with the reaction chamber temperature at least about 10° C. above the deposition temperature. In one embodiment, the post-deposition processing cycle includes performing a water exposure cycle 204 at least two times and performing a pump/purge cycle 206/208 at least two times before and after the water exposure cycle 204. After the ALD SiO$_2$ has been subjected to post-deposition processing, the semiconductor structure 100 may be further processed by conventional techniques to produce semiconductor devices. As a non-limiting example, after post-deposition processing, a portion of the ALD SiO$_2$ may be removed using conventional techniques to form ALD SiO$_2$ spacers that may be useful in processes, such as pitch multiplication. Additionally, the ALD SiO$_2$ that has been processed using the techniques described herein may be used in the fabrication of a trench capacitor, a trench isolation structure, or any other semiconductor device including ALD SiO$_2$.

The pump/purge cycle 302 may be performed at least two times by introducing the inert gas into the reaction chamber and evacuating the inert gas from the reaction chamber, as described in detail above. As a non-limiting example, a single pump/purge cycle 302 may include evacuating the reaction chamber to at least partially remove gases and by-products, introducing nitrogen into the reaction chamber at a temperature in a range of from about 50° C. to about 150° C., evacuating the reaction chamber to at least partially remove gases and by-products, and introducing nitrogen into the reaction chamber at a temperature in a range of from about 50° C. to about 150° C.

The at least one water exposure cycle 202 may include, for example, evacuating the reaction chamber to at least partially remove gases and by-products, introducing water into the reaction chamber, evacuating the reaction chamber to at least partially remove gases and by-products and introducing nitrogen into the reaction chamber at a temperature in a range extending from about 50° C. to about 150° C. As a non-limiting example, the water introduced into the reaction chamber may contact or react with the completed ALD SiO$_2$.

In another embodiment, the post-deposition processing may be used to remove defects produced during the formation of ALD SiO$_2$ spacers, such as during a pitch multiplication process. The post-deposition processing cycle used to remove the defects may be as previously described. In addition to the embodiments described above, the post-deposition processing may be used to remove defects produced during the formation of other ALD SiO$_2$ features.

The following examples serve to illustrate embodiments of the invention in more detail. These examples are not to be construed as being exhaustive or exclusive as to the scope of this invention.

EXAMPLES

In each of the examples, silicon dioxide was formed by an ALD SiO$_2$ process on a number of silicon wafers containing trench-like structures. The silicon wafers were optically inspected to determine the defect counts on the surface of the silicon dioxide at a pre-determined time interval after the completion of the ALD SiO$_2$ deposition process. FIGS. 5 and 6A-6C show optical overview images of the silicon wafers with ALD SiO$_2$ formed thereon at various time intervals. The defects on the ALD SiO$_2$ appear as dark spots on the silicon wafers in FIGS. 5 and 6A-6C. A defect count was measured by determining the number of defects present on the entire silicon wafer at the time of inspection. The silicon wafers were inspected using conventional optical imaging techniques and conventional automated software capable of comparing images and reporting defect counts on the individual silicon wafers.

Figure 5:
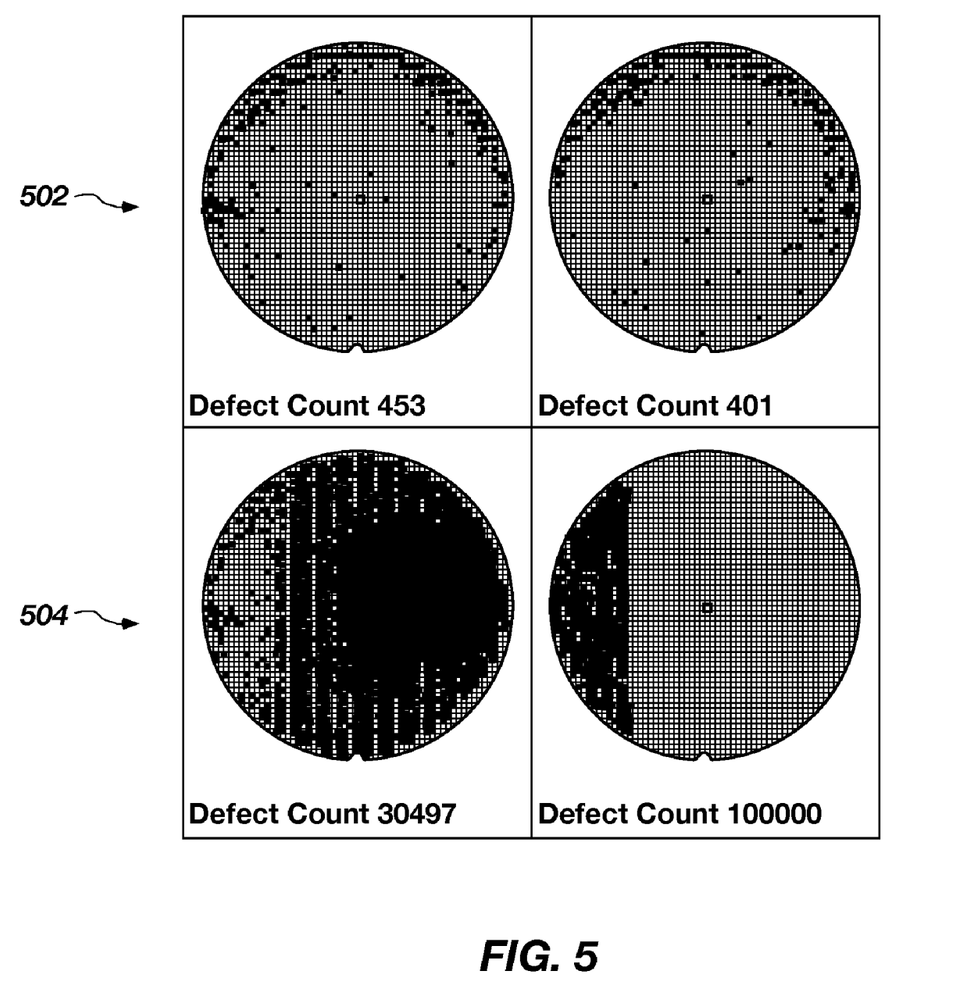
FIG. 5 is a wafer defect map showing an increase in defect count over time on silicon dioxide formed by a conventional ALD process.
Figure 6A:
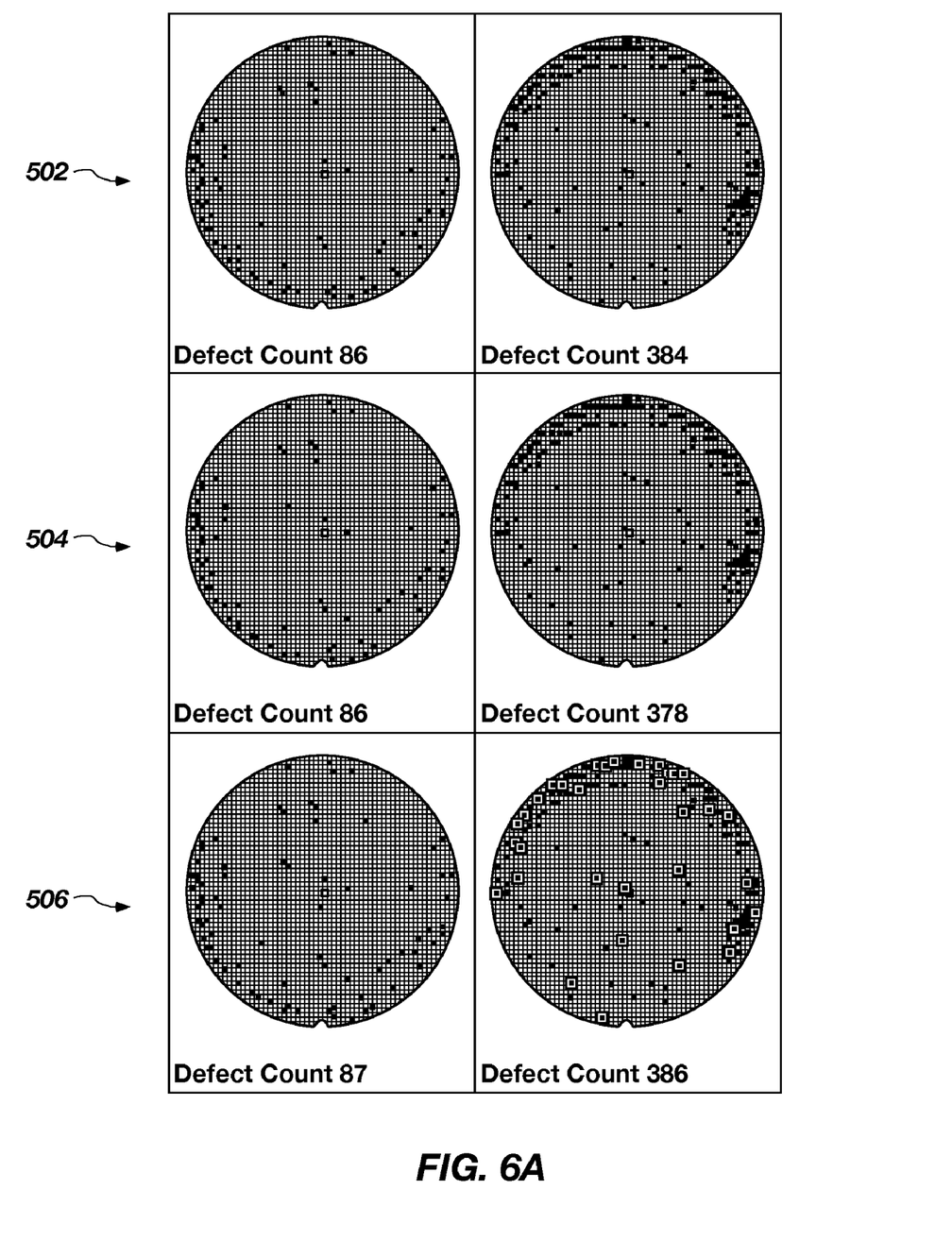
FIGS. 6A-6C are wafer defect maps showing no significant increase in defect count over time on silicon dioxide formed by ALD and processed, post-deposition, in accordance with an embodiment of the invention.

The silicon wafers shown in row 502 of FIGS. 5 and 6A were inspected immediately after deposition of silicon dioxide by ALD. The silicon wafers shown in row 504 of FIGS. 5 and 6A-6C were inspected about 24 hours after formation of the ALD SiO$_2$. The silicon wafers shown in row 506 of FIGS. 6A-6C were inspected about 48 hours after formation of the ALD SiO$_2$.

After formation of the ALD SiO$_2$ on the silicon wafer, the silicon wafers were rinsed with water, which resulted in the removal of crystal-like defects that formed after deposition. The defects that remained on the silicon wafer after being rinsed with water were structural defects or particle defects, which are not affected by the post-deposition processing. In silicon wafers prone to crystal-like defects, the crystal-like defect density conventionally increases over time.

Comparative Example

Silicon dioxide was deposited with the reaction chamber at 75° C. onto silicon wafers by pulsing HCD/pyridine into the reaction chamber for 10 seconds, pumping the reaction chamber for 3 seconds, purging the chamber with nitrogen for 3 seconds and pulsing water/pyridine into the reaction chamber for 10 seconds, pumping the reaction chamber for 3 seconds, purging the chamber with nitrogen for 9 seconds, pumping the reaction chamber for 3 seconds, and purging the chamber with nitrogen for 9 seconds. This ALD deposition sequence was repeated to form silicon dioxide with a thickness of about 35 nm on the surface of the substrate. During the entire sequence, including the pump and purge acts, the nitrogen was introduced into the reaction chamber at a temperature of about 75° C. by pre-heating the gas and/or the delivery lines.

After formation of the about 35 nm silicon dioxide material, the silicon wafers were inspected as described above immediately after deposition and at 24 hours after deposition. Referring to FIG. 5, the row designated as 502 shows the wafers with silicon dioxide formed thereon immediately after deposition. Immediately after deposition, the wafers had defect counts of 453 and 401, possibly due to structural defects and particle defects formed during deposition. The row designated as 504 shows the same wafers 24 hours after the silicon dioxide was deposited on the silicon wafer by the ALD process. After 24 hours, the number of defects on the wafers had increased to 30,497 and 100,000, respectively. The substantial increase in the defect number on the wafers was due to post-deposition formation of crystal-like defects.

Example 1

Silicon dioxide was deposited with the reaction chamber at 75° C. onto silicon wafers by pulsing HCD/pyridine into the reaction chamber for 10 seconds, pumping the reaction chamber for 3 seconds, purging the chamber with nitrogen for 3 seconds and pulsing water/pyridine into the reaction chamber for 10 seconds, pumping the reaction chamber for 3 seconds, purging the chamber with nitrogen for 9 seconds, pumping the reaction chamber for 3 seconds, and purging the chamber with nitrogen for 9 seconds. This ALD deposition sequence was repeated to form silicon dioxide with a thickness of about 35 nm on the surface of the substrate. During the entire sequence, including the pump and purge acts, the nitrogen and HCD/pyridine were each introduced into the reaction chamber at a temperature of about 75° C. by pre-heating the gas and/or the delivery lines.

After formation of the 35 nm silicon dioxide material, the silicon wafers were left in the reaction chamber and were subjected to post-deposition processing by conducting a pump/purge cycle two times, a water exposure cycle four times and another pump/purge cycle two times. During the post-deposition acts, including the pump/purge and water exposure acts, the nitrogen was introduced into the reaction chamber at a temperature of about 150° C. by pre-heating the gas and/or the delivery lines. During part of the post-deposition processing, the nitrogen temperature was from about 75° C. to about 150° C., in a non-steady state. Each of the pump/purge cycles was performed by pumping the reaction chamber for 60 seconds, purging the reaction chamber with nitrogen for 60 seconds, pumping the reaction chamber for 60 seconds, and purging the reaction chamber with nitrogen for 60 seconds. The water exposure cycle was performed by pumping the reaction chamber for about 30 seconds, pulsing water into the reaction chamber for about 30 seconds, pumping the reaction chamber for about 30 seconds, and purging the reaction chamber with nitrogen for 60 seconds.

Referring to FIG. 6A, the silicon wafers were inspected immediately after formation of the ALD SiO$_2$ but before the post-deposition processing was conducted. The silicon wafers shown in row 502 were inspected immediately after formation of the completed silicon dioxide and had defect counts of 86 and 384. The silicon wafers shown in row 504 were inspected 24 hours after formation of the completed silicon dioxide and had defect counts of 86 and 378. The silicon wafers shown in row 506 were inspected 48 hours after formation of the completed silicon dioxide and had defect counts of 87 and 386. As these results show, defect formation on the silicon wafers subjected to the post-deposition processing did not substantially increase within 48 hours of forming the ALD SiO$_2$.

Example 2

Silicon dioxide was deposited with the reaction chamber at 75° C. onto silicon wafers by pulsing HCD/pyridine into the reaction chamber for 10 seconds, pumping the reaction chamber for 3 seconds, purging the reaction chamber with nitrogen for 3 seconds and pulsing water/pyridine into the reaction chamber for 10 seconds, pumping the reaction chamber for 3 seconds, purging the chamber with nitrogen for 9 seconds, pumping the reaction chamber for 3 seconds, and purging the chamber with nitrogen for 9 seconds. This ALD deposition sequence was repeated to form silicon dioxide with a thickness of about 35 nm on the surface of the substrate. During the entire sequence, including the pump and purge acts, the nitrogen and HCD/pyridine were each introduced into the reaction chamber at a temperature of about 100° C. by pre-heating the gas and/or the delivery lines.

The silicon wafers having the 35 nm silicon dioxide material formed, as described above, were left in the reaction chamber and were processed by conducting post-deposition processing that included four repetitions of a pump/purge cycle. During the post-deposition pump and purge acts, the nitrogen was introduced to the reaction chamber at a temperature of about 150° C. by pre-heating the gas and/or the delivery lines. During part of the post-deposition processing, the nitrogen temperature was from 100° C. to about 150° C., in a non-steady state. The pump/purge cycle was performed by pumping the reaction chamber for 60 seconds, purging the reaction chamber with nitrogen for 60 seconds, pumping the reaction chamber for 60 seconds, and purging the reaction chamber with nitrogen for 60 seconds.

Figure 6B:
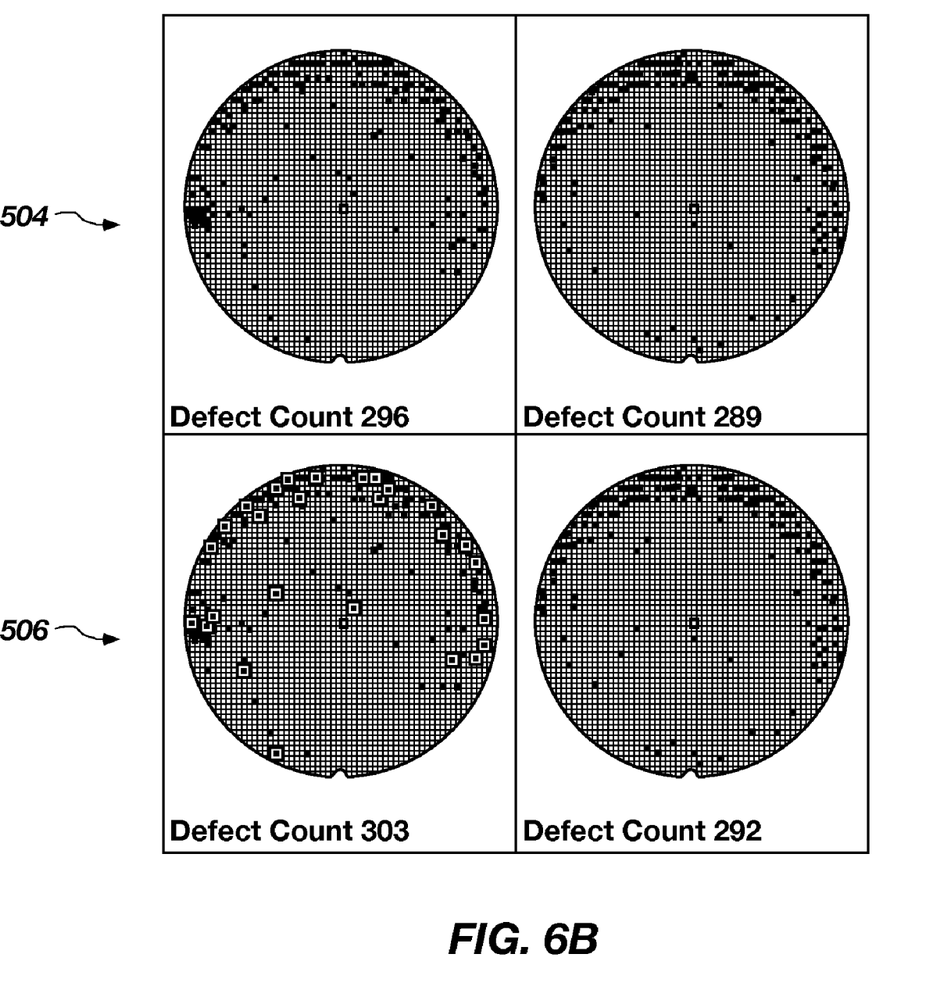

Referring to FIG. 6B, the silicon wafers shown in row 504 were inspected 24 hours after formation of the ALD SiO$_2$ and had defect counts of 296 and 289. The silicon wafers shown in row 506 were inspected 48 hours after formation of the ALD SiO$_2$ and had defect counts of 303 and 292. Thus, defect formation on the silicon wafers subjected to the post-deposition processing did not substantially increase between the time intervals of 24 hours and 48 hours after formation of the ALD SiO$_2$.

Example 3

Silicon dioxide was deposited with the reaction chamber at 75° C. onto silicon wafers by pulsing HCD/pyridine into the reaction chamber for 10 seconds, pumping the reaction chamber for 3 seconds, purging the chamber with nitrogen for 3 seconds and pulsing water/pyridine into the reaction chamber for 10 seconds, pumping the reaction chamber for 3 seconds, and purging the chamber with nitrogen for 3 seconds. This process is very aggressive in terms of short pumping and purging time and is prone to crystal-like defect formation and growth. This ALD deposition sequence was repeated to form silicon dioxide with a thickness of about 35 nm on the surface of the substrate. During the entire sequence, including the pump and purge acts, the nitrogen and HCD/pyridine were each introduced into the reaction chamber at a temperature of about 100° C. by pre-heating the gas and/or the delivery lines.

After formation of the 35 nm silicon dioxide material, the silicon wafers were left in the reaction chamber and were subjected to post-deposition processing by conducting a pump/purge cycle two times, a water exposure cycle four times and another pump/purge cycle two times. During the post-deposition acts, including the pump/purge and water exposure acts, the nitrogen was introduced to the reaction chamber at a temperature of about 150° C. by pre-heating the gas and/or the delivery lines. During part of the post-deposition processing, the nitrogen temperature was from 100° C. to 150° C., in a non-steady state. In addition to that, the reaction chamber temperature set-point was increased from 75° C. to 105° C. with a ramp rate of about 1° C./minute to about 3° C./minute. During the initial acts of the post-deposition processing, the chamber temperature was at a temperature greater than the deposition temperature of about 75° C. and was in the non-steady state. Each of the pump/purge cycles was performed by pumping the reaction chamber for 60 seconds, purging the reaction chamber with nitrogen for 60 seconds, pumping the reaction chamber for 60 seconds, and purging the reaction chamber with nitrogen for 60 seconds. The water exposure cycle was performed by pumping the reaction chamber for about 30 seconds, pulsing water into the reaction chamber for about 30 seconds, pumping the reaction chamber for about 30 seconds, and purging the reaction chamber with nitrogen for 60 seconds.

Figure 6C:
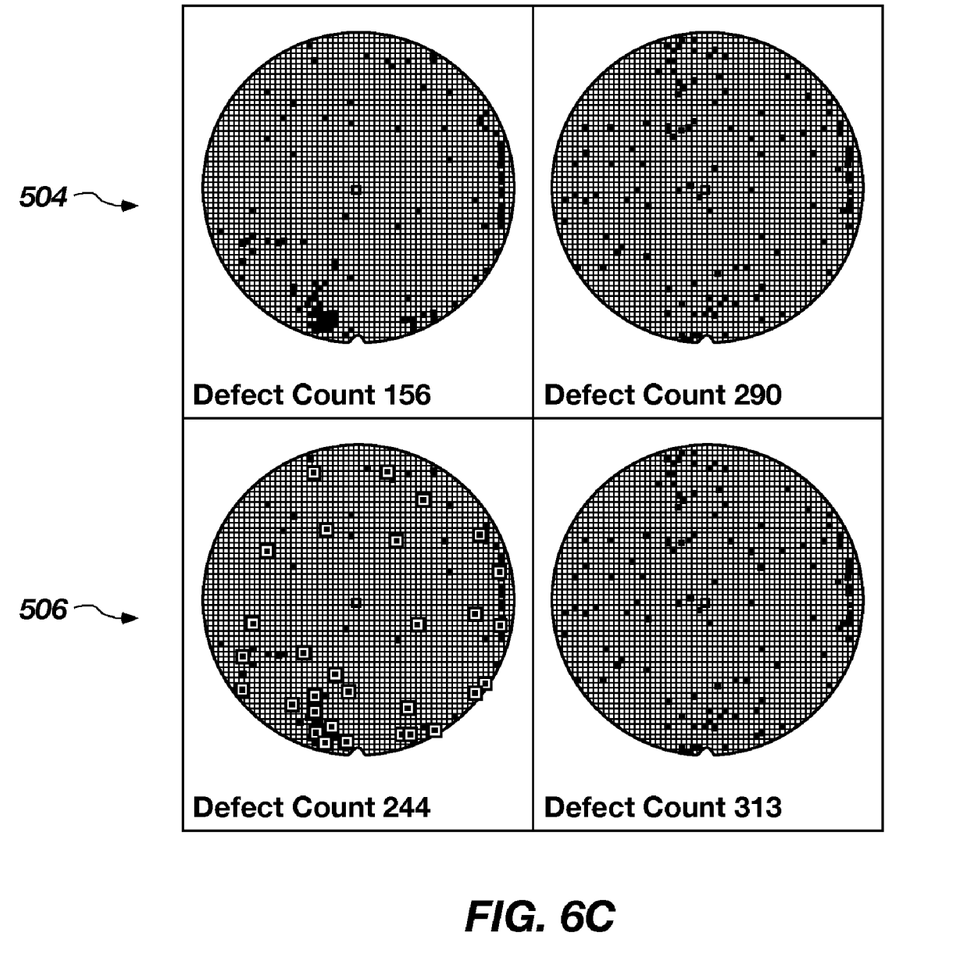

Referring to FIG. 6C, the silicon wafers shown in row 504 were inspected 24 hours after formation of the ALD SiO$_2$ and had defect counts of 156 and 290. The silicon wafers shown in row 506 were inspected 48 hours after formation of the ALD SiO$_2$ and had defect counts of 244 and 313. Between 24 hours after deposition and 48 hours after deposition, an increase in defects on the ALD SiO$_2$ treated using the pump/purge was observed. However, none of the observed defects were the crystal-like defects. As such, the post-deposition processing substantially prevented the increase in the probability and density of the crystal-like defects after deposition of the silicon dioxide by ALD.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the scope of the invention as defined by the following appended claims and their legal equivalents.

What is claimed is:

1. A method for reducing silicon dioxide defects, comprising:
    forming a completed silicon dioxide material on a substrate using an atomic layer deposition process;
    removing excess gases produced by the atomic layer deposition process from the completed silicon dioxide; and
    performing a plurality of water exposure cycles on the completed silicon dioxide material, each of the water exposure cycles consisting of:
        exposing the completed silicon dioxide material to water;
        exposing the completed silicon dioxide to an inert gas; and
        removing gases from the completed silicon dioxide.

2. The method of claim 1, wherein performing a plurality of water exposure cycles comprises performing from two water exposure cycles to ten water exposure cycles.

3. The method of claim 1, wherein performing a plurality of water exposure cycles on the completed silicon dioxide material comprises performing each of the water exposure cycles at a temperature of from about 5° C. to about 50° C. above a temperature at which the completed silicon dioxide material was formed.

4. The method of claim 1, wherein exposing the completed silicon dioxide material to water comprises exposing the completed silicon dioxide material to water for an amount of time of from about 10 seconds to about 120 seconds.

5. The method of claim 1, wherein exposing the completed silicon dioxide material to water comprises exposing the completed silicon dioxide material to water maintained at a temperature of from about 50° C. to about 150° C.

6. The method of claim 1, wherein exposing the completed silicon dioxide material to an inert gas comprises exposing the completed silicon dioxide material to nitrogen at a temperature of from about 50° C. to about 150° C.

7. The method of claim 1, wherein exposing the completed silicon dioxide material to an inert gas comprises exposing the completed silicon dioxide material to the inert gas for an amount of time of from about 5 seconds to about 60 seconds.

8. A method of reducing defects on silicon dioxide, comprising:
    forming a completed silicon dioxide material on a substrate using an atomic layer deposition process by sequentially exposing the substrate to a silicon-containing precursor and an oxygen-containing precursor; and
    processing the completed silicon dioxide material, the processing comprising:
        at least partially removing gases from the completed silicon dioxide material;
        introducing an inert gas onto the completed silicon dioxide material; and
        exposing the completed silicon dioxide material to water.

9. The method of claim 8, wherein introducing an inert gas onto the completed silicon dioxide comprises introducing nitrogen onto the completed silicon dioxide at a temperature in a range extending from about 75° C. to about 150° C.

10. The method of claim 8, wherein processing the completed silicon dioxide material comprises processing the completed silicon dioxide material in a reaction chamber maintained at a temperature of from about 5° C. to about 50° C. above a temperature used to form the completed silicon dioxide material.

11. The method of claim 1, wherein exposing the completed silicon dioxide material to water comprises exposing the completed silicon dioxide material to the water at a temperature of from about 5° C. to about 50° C. above a temperature at which the completed silicon dioxide material was formed.

12. A method of reducing defects on silicon dioxide, comprising:
    forming a completed silicon dioxide material over a plurality of discrete structures using an atomic layer deposition process; and
    performing at least one water cycle on the completed silicon dioxide material, the performing comprising:
        at least partially removing excess precursor gases, excess catalyst, and by-products of the atomic layer deposition process from the completed silicon dioxide material;
        introducing an inert gas to the completed silicon dioxide material; and
        exposing the completed silicon dioxide to a reagent consisting of water.

13. The method of claim 11, wherein exposing the completed silicon dioxide material to a reagent consisting of water comprises exposing the completed silicon dioxide material to the reagent consisting of water at a temperature of from about 5° C. to about 50° C. above a temperature at which the completed silicon dioxide material was formed.

14. The method of claim 12, further comprising repeating the performing the at least one water cycle at least two times.

15. A method for reducing silicon dioxide defects, comprising:
    performing a water exposure cycle in a reaction chamber while a substrate including a completed silicon dioxide material formed thereon using an atomic layer deposition process remains in the reaction chamber, the water exposure cycle comprising:
        evacuating the reaction chamber to remove excess gases produced by the atomic layer deposition process;
        exposing the completed silicon dioxide material to water by introducing water into the reaction chamber for an amount of time of from about 10 seconds to about 120 seconds;
        introducing an inert gas into the reaction chamber; and
        evacuating the reaction chamber.

16. A method of reducing defects on silicon dioxide, comprising:
    producing a completed silicon dioxide material over a plurality of discrete structures using an atomic layer deposition process; and
    performing at least one water cycle on the completed silicon dioxide material, the performing comprising:
        at least partially removing excess precursor gases, excess catalyst, and by-products of the atomic layer deposition process from the completed silicon dioxide material;
        introducing an inert gas to the completed silicon dioxide material; and
        exposing the completed silicon dioxide to water at a temperature of from about 5° C. to about 50° C. above a temperature at which the completed silicon dioxide material was formed.

* * * * *